(12) United States Patent
Hirose

(10) Patent No.: US 6,740,980 B2
(45) Date of Patent: May 25, 2004

(54) SEMICONDUCTOR DEVICE

(75) Inventor: Masahiro Hirose, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/340,621

(22) Filed: Jan. 13, 2003

(65) Prior Publication Data

US 2004/0004291 A1 Jan. 8, 2004

(30) Foreign Application Priority Data

Jul. 4, 2002 (JP) ........................................ 2002-196284

(51) Int. Cl.⁷ .................. H01L 23/48; H01L 23/52; H01L 29/40
(52) U.S. Cl. ..................... 257/777; 257/686; 257/780
(58) Field of Search .................. 257/686, 685, 257/777, 780, 781

(56) References Cited

U.S. PATENT DOCUMENTS

| | | | |
|---|---|---|---|
| 5,608,262 A | * | 3/1997 | Degani et al. |
| 5,760,478 A | * | 6/1998 | Bozso et al. |
| 6,121,682 A | * | 9/2000 | Kim |
| 6,225,699 B1 | * | 5/2001 | Ference et al. |
| 6,238,949 B1 | * | 5/2001 | Nguyen et al. |
| 6,369,448 B1 | * | 4/2002 | McCormick |

FOREIGN PATENT DOCUMENTS

| | | |
|---|---|---|
| JP | 6-204288 | 7/1994 |
| JP | 7-249657 | 9/1995 |
| JP | 2000-228417 | 8/2000 |

* cited by examiner

Primary Examiner—S. V. Clark
(74) Attorney, Agent, or Firm—Leydig, Voit & Mayer, Ltd.

(57) ABSTRACT

A semiconductor chip is die-bonded to a mount substrate, higher bumps and lower bumps are disposed on a face of a second semiconductor chip, and the second semiconductor chip is face-down bonded to the mount substrate and to the first semiconductor chip.

7 Claims, 9 Drawing Sheets

FIG.15
(PRIOR ART)
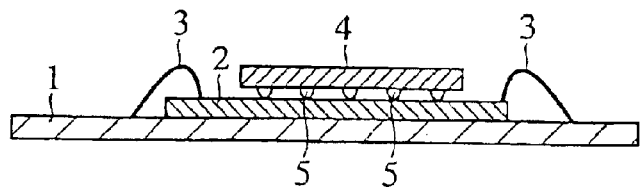
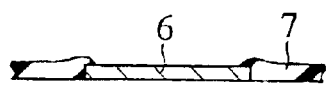
FIG. 16A
PRIOR ART
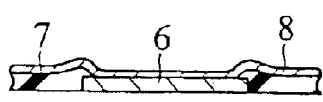
FIG. 16B
PRIOR ART
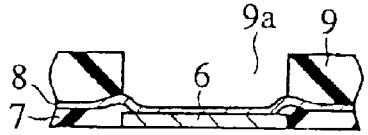
FIG. 16C
PRIOR ART
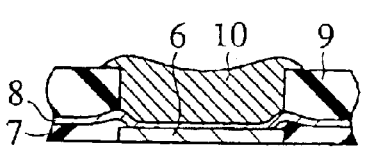
FIG. 16D
PRIOR ART
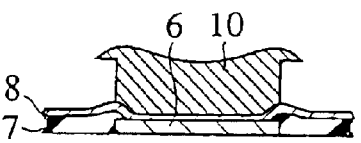
FIG. 16E
PRIOR ART
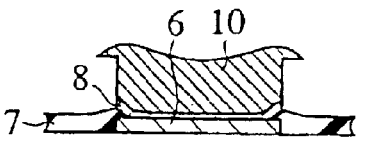
FIG. 16F
PRIOR ART
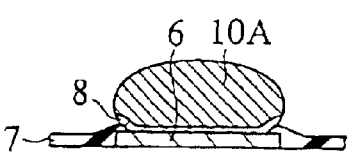
FIG. 16G
PRIOR ART

SEMICONDUCTOR DEVICE

BACKGROUND OF THE INVENTION

1. Field of the Invention

The present invention relates to a semiconductor device that is formed by face-down bonding a semiconductor chip on a mount substrate or board, and relates to a method of producing bumps for a semiconductor chip.

2. Description of Related Art

FIG. 15 is a front view showing a conventional semiconductor device. In the drawing, reference numeral 1 denotes a mount substrate; 2 denotes a first semiconductor chip die-bonded on the mount substrate 1; 3 denotes a bonding wire electrically connecting the mount substrate 1 and the first semiconductor chip 2; 4 denotes a second semiconductor chip that is flip-chip-bonded on the first semiconductor chip 2; and 5 denotes a plurality of bumps that are prepared previously on the second semiconductor chip 4. All of bumps 5 are an electrically conductive material such as solder or gold, the bumps are of uniform height, and the bumps are connected with the pads of the first semiconductor chip 2.

FIGS. 16A–16G are explanatory diagrams of a method of producing the bumps 5. As shown in FIG. 16A, the peripheral portion of pad 6, formed of aluminum or the like, is covered with passivation film 7 in the initial step of the wafer processing. When producing the bumps 5, first, as shown in FIG. 16B, under-bump metal 8 is formed over the pad 6 and the passivation film 7 is formed by sputtering. Then, as shown in FIG. 16C, production mask 9 is placed over the under-bump metal 8, and the opening 9a of the mask is positioned above the pad 6. After that, as shown in FIG. 16D, the opening 9a is filled with solder 10. Subsequently, as shown in FIG. 16E, the production mask 9 is removed, and as shown in FIG. 16F, the under-bump metal 8, except its portion located under the solder 10, is removed by etching. Finally, as shown in FIG. 16G, the solder 10 is heated and melted through use of a reflow furnace, to thereby form bump 10A.

The conventional semiconductor device is arranged as mentioned above. That is, a single second semiconductor chip 4 provided with the bumps 5 of uniform height is purely flip-chip-bonded only on the top surface of the first semiconductor chip 2. As a result, there is the problem that high-density wiring is difficult in the conventional semiconductor device. Moreover, the first semiconductor chip 2 is electrically connected with the mount substrate 1 by use of the bonding wire 3. As a result, there is the problem that reduction of wiring capacitance caused by routing the bonding wire 3 is extremely difficult when the semiconductor chips 2 and 4 are high frequency semiconductor chips.

SUMMARY OF THE INVENTION

The present invention has been accomplished to solve the above-mentioned problems. An object of the present invention is to provide a semiconductor device in which a plurality of semiconductor chips can be mounted on a substrate at high packing densities without using any bonding wire or by using a reduced amount of bonding wire, and is to provide a producing method of bumps for the semiconductor chip for producing the semiconductor device.

According to a first aspect of the present invention, there is provided a semiconductor device in which a semiconductor chip having a plurality of bumps of different heights is face-down bonded on at least either of a mount substrate and another semiconductor chip.

Therefore, the electrical connections between a semiconductor chip and a mount substrate and between the semiconductor chip and the other semiconductor chip can be performed by use of only bumps. As a result, a semiconductor chip can be mounted over the other semiconductor chip mounted on a substrate without using any bonding wire; semiconductor chips can be mounted at high packing densities without using it; and simultaneously the wiring capacitance can be reduced. Additionally, because any bonding wire is not used at all, the mounting method is extremely useful particularly when the semiconductor chips are high frequency chips.

Moreover, according to a second aspect of the present invention, there is provided a producing method of bumps for a semiconductor chip by comprising the steps of: providing a production mask on the semiconductor chip in succession such that the opening of the production mask is positioned on the pad on which a higher bump is to be formed; filling the opening of the production mask with electrically conductive material every time the production mask is provided; and removing all of the production masks.

Therefore, according to the present invention, two or more types of bumps in height can be easily formed. In addition, conventional bumps of uniform height can be changed into bumps of different heights.

BRIEF DESCRIPTION OF THE DRAWINGS

FIG. 15 is a front view showing the semiconductor device according to a conventional technology.

FIGS. 16A to 16G are explanatory sectional diagrams of a method of producing a bump for a semiconductor chip according to a conventional technology.

DETAILED DESCRIPTION OF THE PREFERRED EMBODIMENTS

An embodiment of the present invention will be described below.

Embodiment 1

Figure 1:
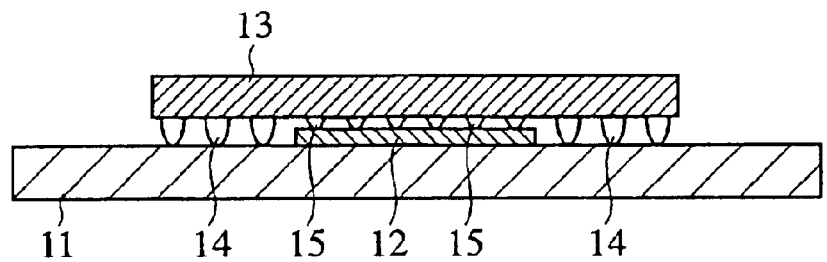
FIG. 1 is a front view showing a semiconductor device according to an embodiment 1 of the present invention.
Figure 2:
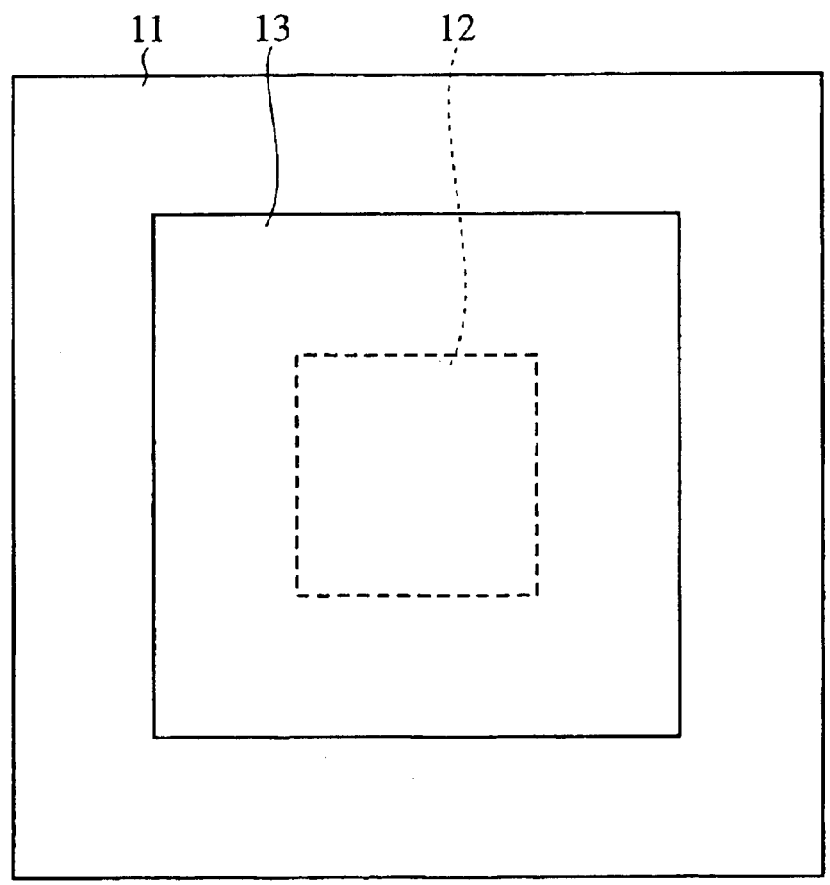
FIG. 2 is a plan view of the semiconductor device shown in FIG. 1.

FIG. 1 is a front view showing a semiconductor device according to an embodiment 1 of the present invention. FIG. 2 is a plan view of the semiconductor device shown in FIG. 1. In the drawings, reference numeral 11 denotes a mount substrate or board; 12 denotes a first semiconductor chip die-bonded on the top surface of the mount substrate 11; 13 denotes a second semiconductor chip which is subjected to face-down bonding on the mount substrate 11 and the first semiconductor chip 12; 14 denotes a plurality of high bumps formed previously on the second semiconductor chip 13; and 15 denotes a plurality of low bumps formed previously on the second semiconductor chip 13. With respect to the plane area, the second semiconductor chip 13 is smaller than the mount substrate 11, and the first semiconductor chip 12 is smaller than the second semiconductor chip 13.

The manufacturing method of the semiconductor device according to the embodiment 1 will now be described below.

The second semiconductor chip 13 on which the high bumps 14 and the low bumps 15 are formed is prepared previously. Then, the first semiconductor chip 12 is die-bonded on the mount substrate 11 in the vicinity of the center of the surface of the mount substrate. Subsequently, the second semiconductor chip 13 is face-down bonded on the mount substrate 11 and the first semiconductor chip 12 such that the second semiconductor chip covers the first semiconductor chip 12. At that time, the high bumps 14 are connected with the lands of the mount substrate 11, and the low bumps 15 are connected with the pads of the first semiconductor chip 12.

As mentioned above, according to the embodiment 1, the high bumps 14 and the low bumps 15 are formed on the second semiconductor chip 13, and the mount substrate 11 and the semiconductor chips 12 and 13 are electrically connected by use of only these bumps 14 and 15. Accordingly, the semiconductor chips 12 and 13 can be mounted three-dimensionally and with high density without using any bonding wire, thereby reducing the wiring capacitance. Because any bonding wire is not used at all, an advantageous effect can be obtained particularly when the semiconductor chips 12 and 13 are high frequency chips.

Embodiment 2

Figure 3:
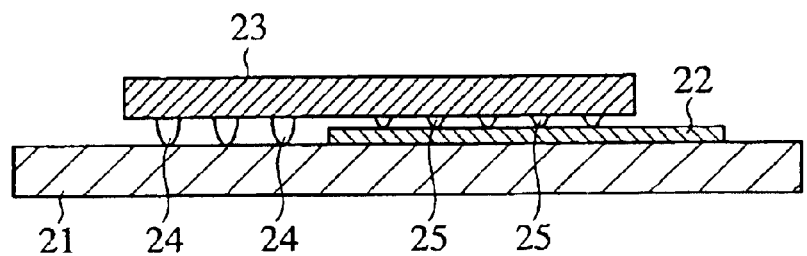
FIG. 3 is a front view showing a semiconductor device according to an embodiment 2 of the present invention.
Figure 4:
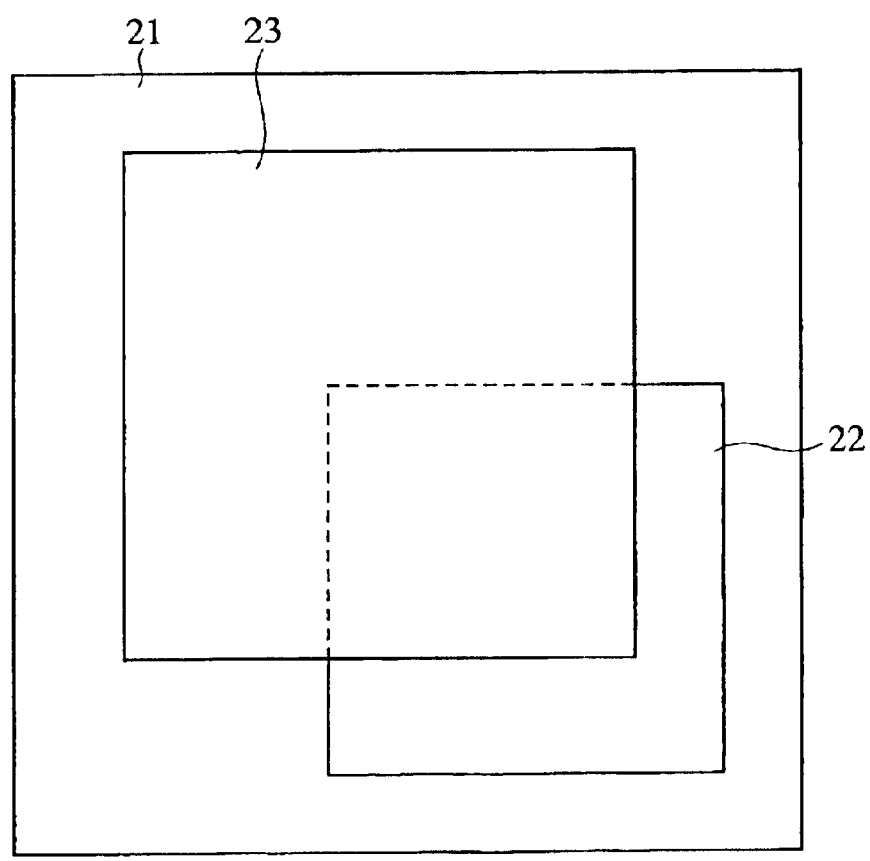
FIG. 4 is a plan view of the semiconductor device shown in FIG. 3.

FIG. 3 is a front view showing the semiconductor device according to an embodiment 2 of the present invention. FIG. 4 is a plan view of the semiconductor device shown in FIG. 3. In the drawings, reference numeral 21 denotes a mount substrate; 22 denotes a first semiconductor chip die-bonded on the top surface of the mount substrate 21; 23 denotes a second semiconductor chip face-down bonded on the mount substrate 21 and the first semiconductor chip 22; 24 denotes a plurality of high bumps prepared previously on the second semiconductor chip 23; and 25 denotes a plurality of low bumps prepared previously on the second semiconductor chip 23. With respect to the plane area, the second semiconductor chip 23 is smaller than the mount substrates 21, the first semiconductor chip 22 is smaller than the second semiconductor chip 23, and a portion of the first semiconductor chip is exposed outside the area of the second semiconductor chip 23.

The manufacturing method of the semiconductor device according to the embodiment 2 will now be described below.

The second semiconductor chip 23 on which the high bumps 24 and the low bumps 25 are formed is previously prepared. Then, the first semiconductor chip 22 is die-bonded on the mount substrate 21 in the vicinity of the corner portion, for instance, of the surface of the mount substrate 21. Subsequently, the second semiconductor chip 23 is subjected to face-down bonding on the mount substrate 21 and the first semiconductor chip 22 such that the second semiconductor chip covers a larger part of the first semiconductor chip 22. At that time, the high bumps 24 are connected with the lands of the mount substrate 21, and the low bumps 25 are connected with the pads of the first semiconductor chip 22.

As mentioned above, according to the embodiment 2, because the high bumps 24 and the low bumps 25 are formed on the second semiconductor chip 23, and the mount substrate 21 and the semiconductor chips 22 and 23 are electrically connected by use of only these bumps 24 and 25, the similar effect to that of the embodiment 1 is obtained. In addition, a variety of combination of the mount substrate 21 and the semiconductor chips 22 and 23 can be performed by changing the location of the first semiconductor chip 22.

Embodiment 3

Figure 5:
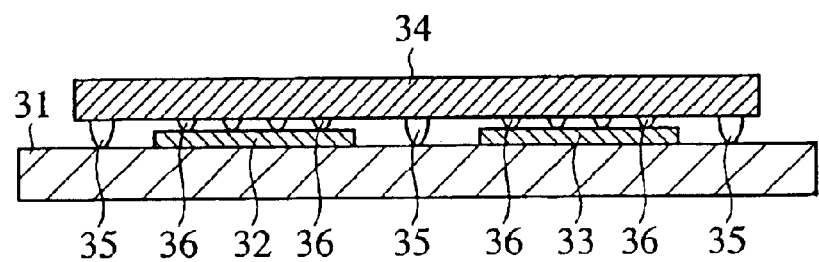
FIG. 5 is a front view showing a semiconductor device according to an embodiment 3 of the present invention.
Figure 6:
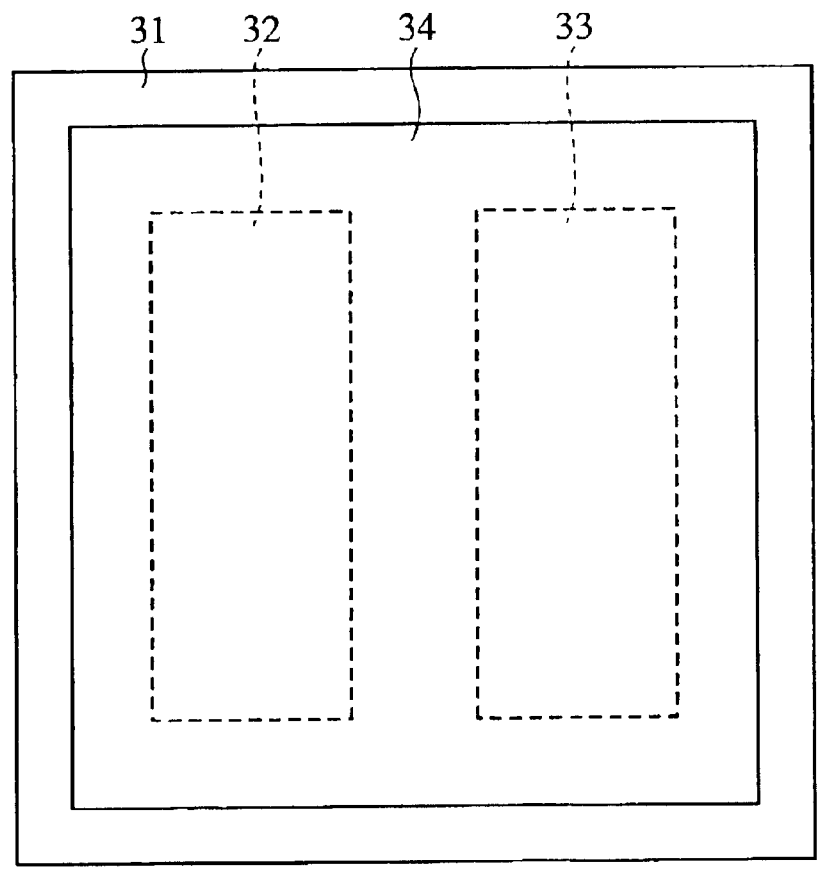
FIG. 6 is a plan view of the semiconductor device shown in FIG. 5.

FIG. 5 is a front view showing the semiconductor device according to an embodiment 3 of the present invention. FIG. 6 is a plan view of the semiconductor device shown in FIG. 5. In the drawings, reference numeral 31 denotes a mount substrate; 32 denotes a first semiconductor chip die-bonded on the top surface of the mount substrate 31; 33 denotes a second semiconductor chip die-bonded on the top surface of the mount substrate 31 aside from the first semiconductor chip 32; 34 denotes a third semiconductor chip face-down bonded on the first semiconductor chip 32 and the second semiconductor chip 33; 35 denotes a plurality of high bumps formed previously on the third semiconductor chip 34 and 36 denotes an a plurality of low bumps formed previously on the third semiconductor chip 34. The plane area of the third semiconductor chip 34 is smaller than that of the mount substrates 31. Additionally, the first semiconductor chip 32 and the second semiconductor chip 33 are of equal size, and are disposed within the area of the third semiconductor chip 34.

The manufacturing method of the semiconductor device according to the embodiment 3 will now be described below.

The second semiconductor chip 34 on which the high bumps 35 and the low bumps 36 are formed previously is first prepared. Then, the first semiconductor chip 32 and the second semiconductor chip 33 are die-bonded on the surface of the mount substrate 31. Subsequently, the third semiconductor chip 34 is face-down bonded on the mount substrate 31, the first semiconductor chip 32 and the second semiconductor chip 33 such that the third semiconductor chip 34 covers the first semiconductor chip 32 and the second semiconductor chip 33. At that time, the high bumps 35 are connected with the lands of the mount substrate 31, and the low bumps 36 are connected with the pads of the first semiconductor chip 32 and the second semiconductor chip 33.

As mentioned above, according to the embodiment 3, because the high bumps 35 and the low bumps 36 are formed previously on the third semiconductor chip 34, and the mount substrate 31 and the semiconductor chips 32–34 are electrically connected by use of only these bumps 35 and 36, the similar effect to that of the embodiment 1 is obtained.

Embodiment 4

Figure 7:
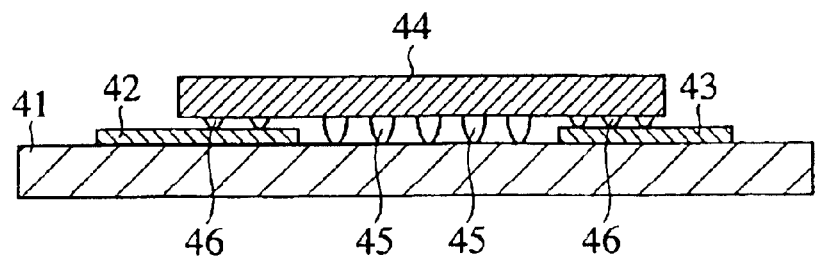
FIG. 7 is a front view showing a semiconductor device according to an embodiment 4 of the present invention.
Figure 8:
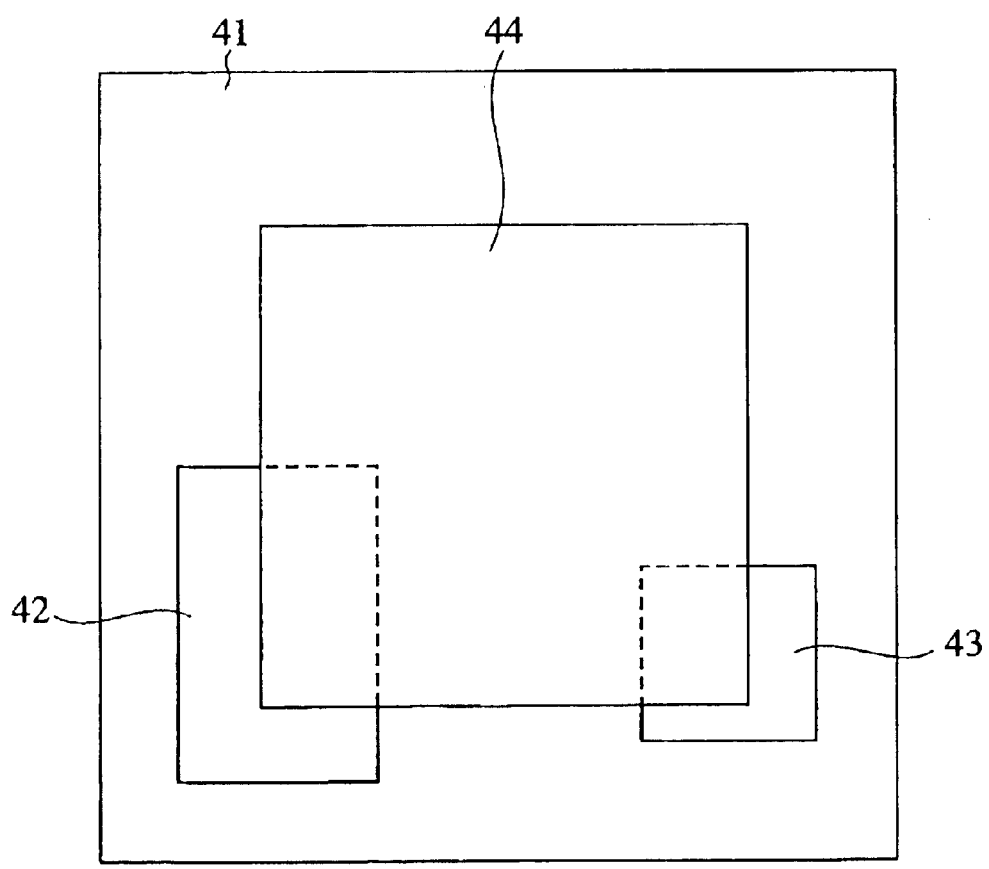
FIG. 8 is a plan view of the semiconductor device shown in FIG. 7.

FIG. 7 is a front view showing the semiconductor device according to an embodiment 4 of the present invention. FIG. 8 is a plan view of the semiconductor device shown in FIG. 7. In the drawings, reference numeral 41 denotes amount substrate; 42 denotes a first semiconductor chip die-bonded on the top surface of the mount substrate 41 in one corner portion of the mount substrate, for instance; 43 denotes a second semiconductor chip die-bonded on the top surface of the mount substrate 41 in the other corner portion of the mount substrate, for instance; 44 denotes a third semiconductor chip face-down bonded on the mount substrate 41, the first semiconductor chip 42, and the second semiconductor chip 43; 45 denotes a plurality of high bumps formed previously on the third semiconductor chip 44; and 46 denotes an a plurality of low bumps formed previously on the third semiconductor chip 44. With respect to the plane area, the third semiconductor chip 44 is smaller than the mount substrate 41; the first semiconductor chip 42 and the second semiconductor chip 43 are smaller than the third semiconductor chip 44; and a portion of the first semiconductor chip and a portion of the second semiconductor chip are exposed outside the area of the third semiconductor chip 44.

The manufacturing method of the semiconductor device according to the embodiment 4 will now be described below.

The third semiconductor chip 44 on which the high bumps 45 and the low bumps 46 are formed previously is first prepared. Then, the first semiconductor chip 42 and the second semiconductor chip 43 are die-bonded on the surface of the mount substrate 41. Subsequently, the third semiconductor chip 44 is face-down bonded on the mount substrate 41, the first semiconductor chip 42 and the second semiconductor chip 43 such that the third semiconductor chip covers a part of the first semiconductor chip 42 and a part of the second semiconductor chip 43. At that time, the high bumps 45 are connected with the lands of the mount substrate 41 and the low bumps 46 are connected with the pads of the first semiconductor chip 42 and the second semiconductor chip 43.

As mentioned above, according to the embodiment 4, because the high bumps 45 and the low bumps 46 are formed on the third semiconductor chip 44, and the mount substrate 41 and the semiconductor chips 42–44 are electrically connected by use of only these bumps 45 and 46, the similar effect to that of the embodiment 3 is obtained. In addition, a variety of combinations of the mount substrate 41 and the semiconductor chips 42–44 can be performed by changing the locations of the first semiconductor chip 42 and the second semiconductor chip 43.

Embodiment 5

Figure 9:
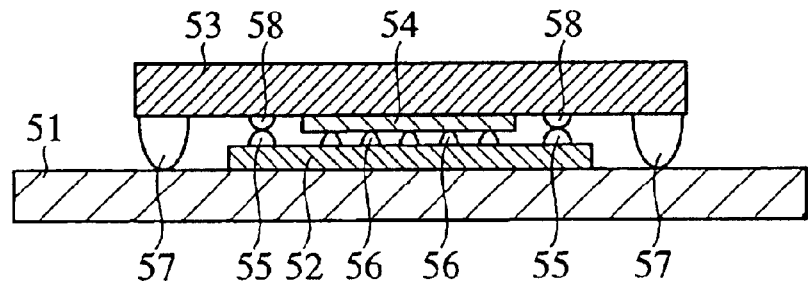
FIG. 9 is a front view showing a semiconductor device according to an embodiment 5 of the present invention.
Figure 10:
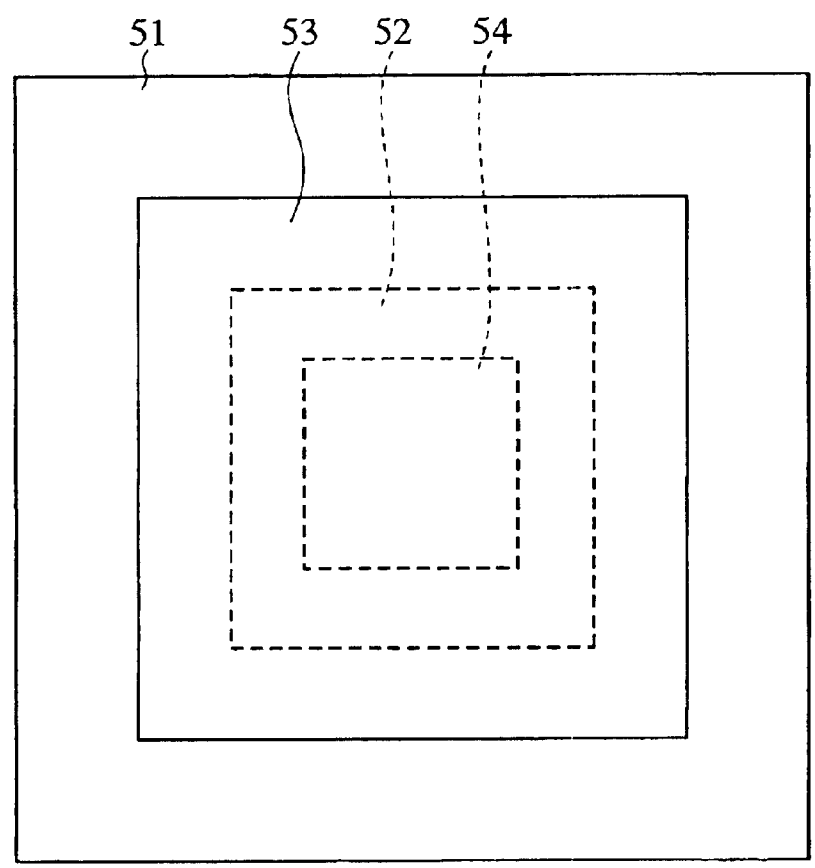
FIG. 10 is a plan view of the semiconductor device shown in FIG. 9.

FIG. 9 is a front view showing the semiconductor device according to an embodiment 5 of the present invention. FIG. 10 is a plan view of the semiconductor device shown in FIG. 9. In the drawings, reference numeral 51 denotes a mount substrate; 52 denotes a first semiconductor chip die-bonded on the top surface of the mount substrate 51; 53 denotes a second semiconductor chip face-down bonded on the mount substrate 51 and the first semiconductor chip 52; 54 denotes a third semiconductor chip previously die-bonded on the second semiconductor chip 53; 55 denotes a plurality of high bumps formed previously on the first semiconductor chip 52; 56 denotes a plurality of low bumps formed previously on the first semiconductor chip 52; 57 denotes a plurality of high bumps formed previously on the second semiconductor chip 53; and 58 denotes a plurality of low bumps formed previously on the second semiconductor chip 53. In addition, with respect to the plane area, the second semiconductor chip 53 is smaller than the mount substrate 51, the first semiconductor chip 52 is smaller than the second semiconductor chip 53, and the third semiconductor chip 54 is smaller than the first semiconductor chip 52.

The manufacturing method of the semiconductor device according to the embodiment 5 will now be described below. The first semiconductor chip 52 on which the high bumps 55 and the low bumps 56 are formed previously is first prepared. After that, the second semiconductor chip 53 on which the third semiconductor chip 54 is die-bonded and the high bumps 57 and the low bumps 58 are formed previously, is prepared. Then, the first semiconductor chip 52 is die-bonded on the surface of the mount substrate 51 in the vicinity of the center of the surface. Subsequently, the second semiconductor chip 53 is face-down bonded on the mount substrate 51 and the first semiconductor chip 52 such that-the second semiconductor chip covers the first semiconductor chip 52. At that time, the high bumps 55 of the first semiconductor chip 52 and the low bumps 58 of the second semiconductor chip 53 are connected to each other; the low bumps 56 of the first semiconductor chip 52 are connected with the pads of the third semiconductor chip 54; and the high bumps 57 of the second semiconductor chip 53 are connected with the lands of the mount substrate 51.

As mentioned above, according to the embodiment 5, the high bumps 55 and the low bumps 56 are formed on the first semiconductor chip 52; the high bumps 57 and the low bumps 58 are formed on the second semiconductor chip 53; and the mount substrate 51 and the semiconductor chips 52–54 are electrically connected by use of only these bumps 55–58. For this reason, higher-density and more various mounting than the mounting according to the embodiments 1–4 can be performed. In addition, with respect to the other features, the similar effect to that of the embodiment 3 is obtained.

Embodiment 6

Figure 11:
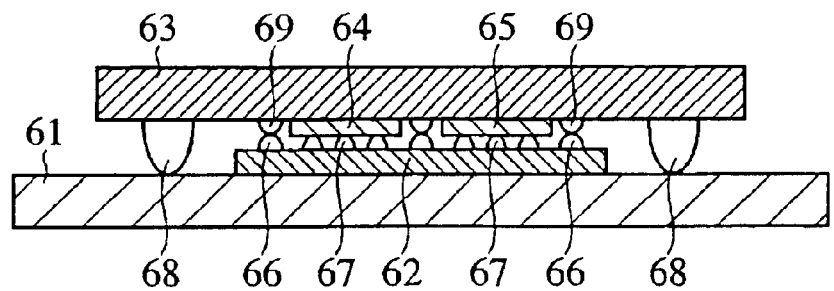
FIG. 11 is a front view showing a semiconductor device according to an embodiment 6 of the present invention.
Figure 12:
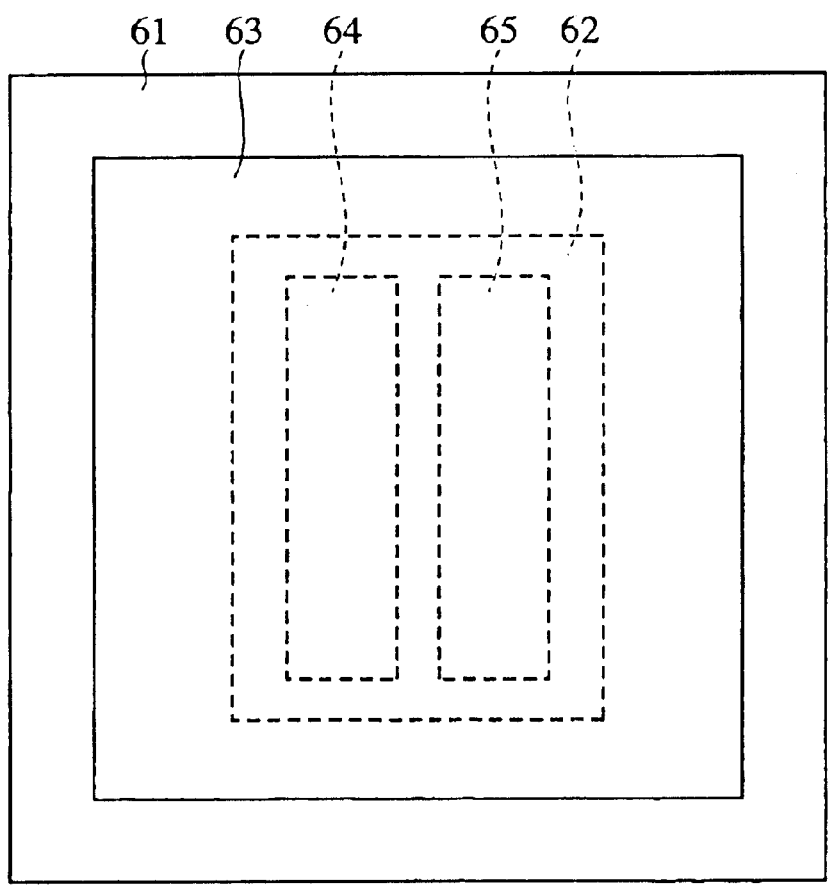
FIG. 12 is a plan view of the semiconductor device shown in FIG. 11.

FIG. 11 is a front view showing the semiconductor device according to an embodiment 6 of the present invention. FIG. 12 is a plan view of the semiconductor device shown in FIG. 11. In the drawings, reference numeral 61 denotes a mount substrate; 62 denotes a first semiconductor chip die-bonded on the top surface of the mount substrate 61; 63 denotes a second semiconductor chip face-down bonded on the mount substrate 61 and the first semiconductor chip 62; 64 denotes a third semiconductor chip previously die-bonded on the second semiconductor chip 63; 65 denotes a fourth semiconductor chip previously die-bonded on the second semiconductor chip 63; 66 denotes a plurality of high bumps formed previously on the first semiconductor chip 62; 67 denotes a plurality of low bumps formed previously on the first semiconductor chip 62; 68 denotes a plurality of high bumps formed previously on the second semiconductor chip 63; and 69 denotes a plurality of low bumps formed previously on the second semiconductor chip 63. With respect to the plane area, the semiconductor chips in the embodiment 6 are equal to the semiconductor chips in the embodiment 5 except that the third semiconductor chip 64 and the fourth semiconductor chip 65 are used in the embodiment 6 instead of the third semiconductor chip 54 used in the embodiment 5.

The manufacturing method of the semiconductor device according to the embodiment 6 will now be described below.

The first semiconductor chip 62 on which the high bumps 66 and the low bumps 67 are formed previously is first prepared. The second semiconductor chip 63 on which the third semiconductor chip 64 and the fourth semiconductor chip 65 are die-bonded, and the high bumps 68 and the low bumps 69 are formed previously, is next prepared. Then, the first semiconductor chip 62 is die-bonded on the surface of the mount substrate 61 in the vicinity of the center of the surface. Subsequently, the second semiconductor chip 63 is face-down bonded on the mount substrate 61 and the first semiconductor chip 62 such that the second semiconductor chip covers the first semiconductor chip 62. At that time, the bumps 66–69 are connected in a manner similar that connecting the bumps 55–58 in the embodiment 5.

As mentioned above, according to the embodiment 6, the high bumps 66 and the low bumps 67 are formed on the first semiconductor chip 62; the high bumps 68 and the low bumps 69 are formed on the second semiconductor chip 63; and the mount substrate 61 and the semiconductor chips 62–65 are electrically connected by use of only these bumps 66–69. For this reason, the similar effect to that of the embodiment 5 is obtained.

Embodiment 7

Figure 13:
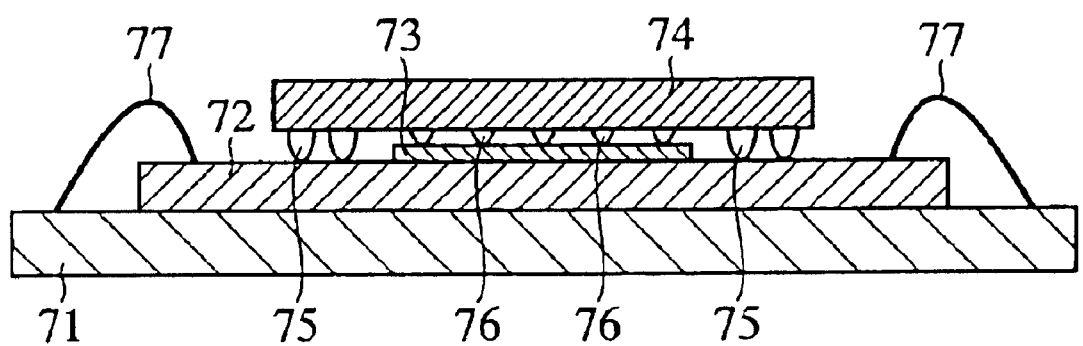
FIG. 13 is a front view showing a semiconductor device according to an embodiment 7 of the present invention.

FIG. 13 is a front view showing the semiconductor device according to an embodiment 7 of the present invention. In the drawing, reference numeral 71 denotes a mount substrate; 72 denotes a first semiconductor chip die-bonded on the top surface of the mount substrate 71; 73 denotes a second semiconductor chip die-bonded on the top surface of the first semiconductor chip 72; 74 denotes the third semiconductor chip face-down bonded on the first semiconductor chip 72 and the second semiconductor chip 73; 75 denotes a plurality of high bumps formed previously on the third semiconductor chip 74; 76 denotes a plurality of low bumps formed previously on the third semiconductor chip 74; and 77 detotes a bonding wire connecting the land of the mount substrate 71 and the pad of the first semiconductor chip 72. In addition, with respect to the plane area, the first semiconductor chip 72 is smaller than the mount substrate 71, the third semiconductor chip 74 is smaller than the first semiconductor chip 72, and the second semiconductor chip 73 is smaller than the third semiconductor chip 74.

The manufacturing method of the semiconductor device according to the embodiment 7 will now be described below.

The third semiconductor chip 74 on which the high bumps 75 and the low bumps 76 are formed previously is first prepared. Then, the first semiconductor chip 72 is die-bonded on the surface of the mount substrate 71 in the vicinity of the center of the surface. Subsequently, the second semiconductor chip 73 is die-bonded on the surface of the first semiconductor chip 72 in the vicinity of the center of the surface. Moreover, the third semiconductor chip 74 is face-down bonded on the first semiconductor chip 72 and the second semiconductor chip 73. At that time, the high bumps 75 are connected with the pads of the first semiconductor chip 72 and the low bumps 76 are connected with the pads of the second semiconductor chip 73. The lands of the mount substrate 71 and the pads of the first semiconductor chip 72 are connected by use of the bonding wires 77.

As mentioned above, according to the embodiment 7, the high bumps 75 and the low bumps 76 are formed on the third semiconductor chip 74, and the semiconductor chips 72–74 are electrically; connected by use of only these bumps 75 and 76. For this reason, the number of bonding wires 77 can be reduced compared with the number of the ones in conventional semiconductors. Additionally, the almost similar effect to that of the embodiment 5 is obtained.

Embodiment 8

Figure 14A:
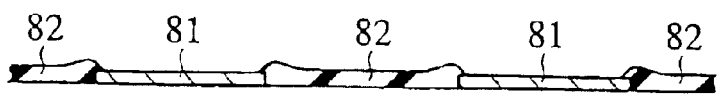
FIGS. 14A to 14I are explanatory sectional diagrams of a method of producing bumps for a semiconductor chip according to an embodiment 8 of the present invention.

FIGS. 14A–14I are explanatory diagrams of the producing method of bumps for a semiconductor chip according to an embodiment 8 of the present invention. The bumps 14, 15, 24, 25, 35, 36, 45, 46, 55–58, 66–69, 75, and 76 in above-mentioned embodiments 1–7 are produced by use of this producing method. As shown in FIG. 14A, the peripheral portion of pad 81 formed of aluminum or the like is covered with passivation film 82 in the initial step of the wafer processing.

Figure 14B:
Figure 14C:
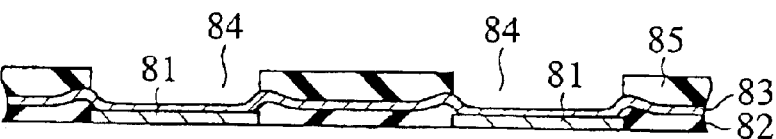
Figure 14D:
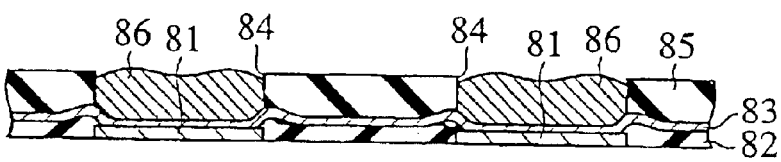

First, as shown in FIG. 14B, under-bump metal 83 is formed over the pad 81 and the passivation film 82 by means of spattering. Subsequently, as shown in FIG. 14C, first production mask 85 having openings 84 above the pads 81 is disposed over the under-bump metal layer 83. Then, as shown in FIG. 14D, solders 86 are filled into the openings 84 in which the bumps are to be formed, by means of electroplating or the like. Other electrically conductive material such as gold, for instance, can be used instead of the solder 86.

Figure 14E:
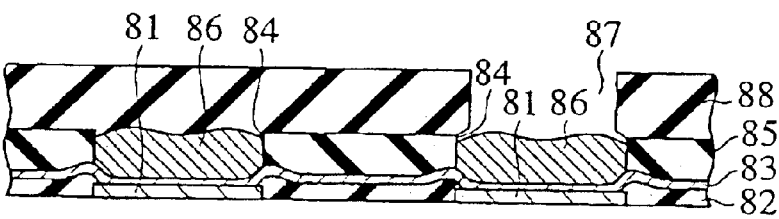
Figure 14F:
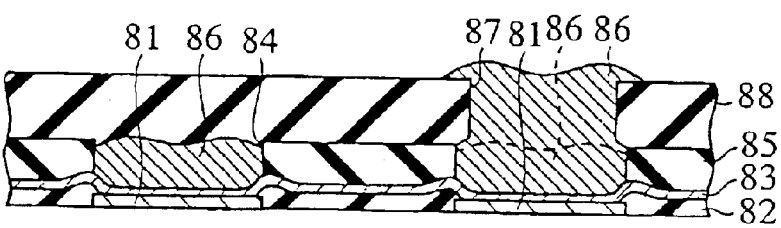

Subsequently, as shown in FIG. 14E, second production mask 88 having opening 87 above the solder 86 that is to be made higher is disposed over the first production mask 85. As shown in FIG. 14F, solder 86 is filled into the opening 87 of the second production mask 88 similarly to the above-described manner.

Figure 14G:
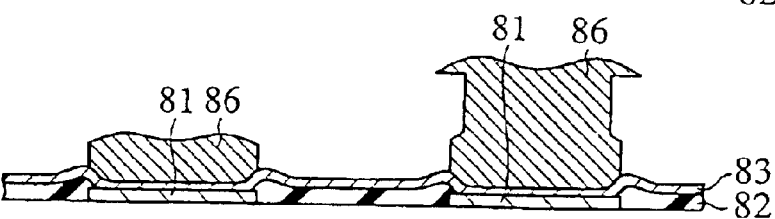
Figure 14H:
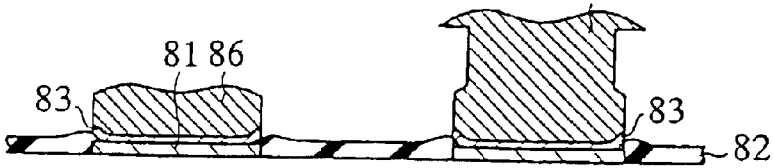
Figure 14I:
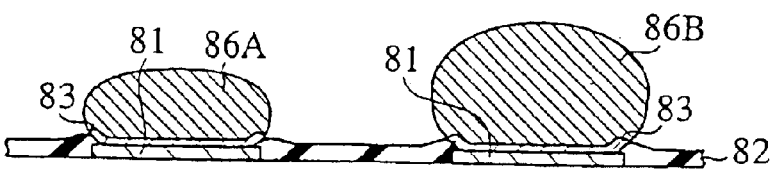

Then, as shown in FIG. 14G, the first production mask 85 and the second production mask 88 are removed. In addition, as shown in FIG. 14H, the under bump metal layer 83 is removed by means of etching with the exclusion of the portion thereof located under the solder 86. Finally, as shown in FIG. 14I, the solders 86 are heated and melt through use of a reflow furnace, to thereby form low bump 86A and high bump 86B.

Instead of using the first production mask 85 having the opening 84 and the second production mask 88 having the opening 87, the openings 84 and 87 can be provided by means of photolithography technology including the steps of photoresist-applying, photomask-positioning, photoresist-exposuring, photoresist-developing, photoresist-etching, and photoresist-removing. Moreover, it is needless to say that a higher bump can be formed by repeating these steps.

As mentioned above, according to the embodiment 8, two or more different types of bumps in height can be formed by means of stacking similar solder 86 on the solder 86 first formed. Therefore, conventional bumps of uniform height formed on a semiconductor chip can be changed into two or more different types of bumps in height by means of repeating the steps of providing the production masks 85 and 88 over the conventional bumps of uniform height on the semiconductor chip.

Additionally, in above-mentioned the embodiment 5, the high bumps 55 of the first semiconductor chip 52 were connected with the low bumps 58 of the second semiconductor chip 53. However, the second semiconductor chip 53 can be bonded on the first semiconductor chip 52 without forming the low bumps 58 of the second semiconductor chip 53 by making the high bumps 55 of the first semiconductor chip 52 higher, or without forming the high bumps 55 of the first semiconductor chip 52 by making the low bumps 58 of the second semiconductor chip 53 higher. This matter can be applied to the embodiment 6. Additionally, two types of bumps in height are described in above-mentioned embodiments 1–8. However, it is needless to say that three or more types of bumps in height and different types of semiconductor chips in thickness can be combined.

What is claimed is:

1. A semiconductor device comprising:
 a mount substrate;
 a first semiconductor chip die-bonded to the mount substrate; and
 a second semiconductor chip having a plurality of bumps of different heights on a face, wherein
  the second semiconductor chip having the plurality of the bumps of different heights is face-down bonded by the bumps to the mount substrate and the first semiconductor chip, and a part of the first semiconductor chip is offset from and not directly opposite the second semiconductor chip.

2. A semiconductor device comprising:

a mount substrate;

a first semiconductor chip die-bonded to the mount substrate;

a second semiconductor chip having a plurality of bumps of different heights on a face, wherein the second semiconductor chip having the plurality of the bumps of different heights is face-down bonded by the bumps to the mount substrate and the first semiconductor chip; and a third semiconductor chip die-bonded to the mount substrate.

3. The semiconductor device according to claim 2, wherein all of the first semiconductor chip and all of the third semiconductor chip are directly opposite the second semiconductor chip.

4. The semiconductor device according to claim 2, wherein a part of at least one of the first semiconductor chip and the third semiconductor chip is not directly opposite the second semiconductor chip.

5. A semiconductor device comprising:

a mount substrate;

a first semiconductor chip die-bonded to the mount substrate;

a second semiconductor chip having a plurality of bumps of different heights on a face, wherein the second semiconductor chip having the plurality of the bumps of different heights is face-down bonded by the bumps to the mount substrate and the first semiconductor chip; and a third semiconductor chip, wherein bumps of different heights are disposed on the first semiconductor chip, and the third semiconductor chip is die-bonded to the second semiconductor chip.

6. The semiconductor device according to claim 5, comprising a fourth semiconductor chip die-bonded to the second semiconductor chip.

7. A semiconductor device comprising:

a mount substrate;

a first semiconductor chip;

a second semiconductor chip having a plurality of bumps of different heights on a face, wherein the second semiconductor chip having the plurality of the bumps of different heights is face-down bonded by the bumps to at least one of the mount substrate and the first semiconductor chip;

a third semiconductor chip; and a bonding wire, wherein the first semiconductor chip is die-bonded to the mount substrate, the second semiconductor chip is die-bonded to the first semiconductor chip, the mount substrate and the first semiconductor chip are connected by the bonding wire, a plurality of bumps of different heights are disposed on a face of the third semiconductor chip, and the third semiconductor chip is face-down bonded to the first semiconductor chip and the second semiconductor chip.

* * * * *